United States Patent
Bisschops et al.

(10) Patent No.: US 6,816,238 B2
(45) Date of Patent: Nov. 9, 2004

(54) MOTION FEED-THROUGH INTO A VACUUM CHAMBER AND ITS APPLICATION IN LITHOGRAPHIC PROJECTION APPARATUSES

(75) Inventors: Theodorus H. J. Bisschops, Eindhoven (NL); Jakob Vijfvinkel, Eindhoven (NL); Hermanus M. J. R. Soemers, Mierlo (NL); Johannes C. Driessen, Eindhoven (NL); Michael J. M. Renkens, Geleen (NL); Adrianus G. Bouwer, Nuenen (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/196,712

(22) Filed: Jul. 17, 2002

(65) Prior Publication Data
US 2002/0180946 A1 Dec. 5, 2002

Related U.S. Application Data (63) Continuation of application No. 09/551,229, filed on Apr. 17, 2000, now Pat. No. 6,445,440.

(30) Foreign Application Priority Data

Apr. 19, 1999 (EP) .............................................. 99201220

(51) Int. Cl.[7] .............................................. G03B 27/58
(52) U.S. Cl. ............................................ 355/72; 355/75
(58) Field of Search .............................. 355/30, 53, 67, 355/72–76; 310/10, 12; 414/225, 321, 416

(56) References Cited

U.S. PATENT DOCUMENTS

| | | |
|---|---|---|
| 4,191,385 A | 3/1980 | Fox et al. |
| 4,383,178 A | 5/1983 | Shibata et al. |
| 4,993,696 A | 2/1991 | Furukawa et al. |
| 5,134,640 A | 7/1992 | Hirokawa et al. |
| 5,301,013 A | 4/1994 | Meijer et al. |
| 5,677,758 A | 10/1997 | McEachern et al. |
| 5,825,470 A | 10/1998 | Miyai et al. |

OTHER PUBLICATIONS

Ceglio et al., "Front–end design issues in soft–x–ray projection lithography," *Applied Optics*, Optical Society of America, Washington, US, vol. 32, No. 34, Dec. 1, 1993, pp. 7050–7056 (Abstract No. XP000414608 ISSN: 0003–6935).

*Primary Examiner*—Henry Hung Nguyen
(74) *Attorney, Agent, or Firm*—Pillsbury Winthrop LLP

(57) ABSTRACT

A long-stroke movement is fed-through into a vacuum chamber by providing a sliding seal over an aperture in the vacuum chamber wall. The object to be moved, which may be a mask or wafer table in a lithographic apparatus, within the vacuum chamber is connected to or mounted on the sliding seal and moved by movement of the sliding seal. The sliding seal may be a plate, a bowl or a labyrinth of interleaved plates.

24 Claims, 5 Drawing Sheets

MOTION FEED-THROUGH INTO A VACUUM CHAMBER AND ITS APPLICATION IN LITHOGRAPHIC PROJECTION APPARATUSES

This is a continuation Application of U.S. application Ser. No. 09/551,229 filed Apr. 17, 2000 now U.S. Pat. No. 6,445,440, the entire contents of which is hereby incorporated by reference.

BACKGROUND OF THE INVENTION

1. Field of the Invention

The present invention relates to motion feed-through devices into vacuum chambers from the exterior. More particularly, the invention relates to the application of such devices in lithographic projection apparatuses that have a radiation system for supplying a projection beam of radiation; a first object table provided with a mask holder for holding a mask; a second object table provided with a substrate holder for holding a substrate; and a projection system for imaging an irradiated portion of the mask onto a target portion of the substrate.

2. Discussion of Related Art

For the sake of simplicity, the projection system may hereinafter be referred to as the "lens", however, this term should be broadly interpreted as encompassing various types of projection system, including refractive optics, reflective optics, catadioptric systems, and charged particle optics, for example. The radiation system may also include elements operating according to any of these principles for directing, shaping or controlling the projection beam of radiation, and such elements may also be referred to below, collectively or singularly, as a "lens". In addition, the first and second object tables may be referred to as the "mask table" and the "substrate table", respectively. Further, the lithographic apparatus may be of a type having two or more mask tables and/or two or more substrate tables. In such "multiple stage" devices the additional tables may be used in parallel, or preparatory steps may be carried out on one or more stages while one or more other stages are being used for exposures. Twin stage lithographic apparatuses are described in International Patent Applications WO 98/28665 and WO 98/40791, for example the entire contents of each are incorporated herein by reference.

Lithographic projection apparatuses can be used, for example, in the manufacture of integrated circuits (ICs). In such a case, the mask (reticle) may contain a circuit pattern corresponding to an individual layer of the IC, and this pattern can be imaged onto a target area (die) on a substrate (silicon wafer) which has been coated with a layer of photosensitive material (resist). In general, a single wafer will contain a whole network of adjacent dies which are successively irradiated via the reticle, one at a time. In one type of lithographic projection apparatus, each die is irradiated by exposing the entire reticle pattern onto the die in one go; such an apparatus is commonly referred to as a wafer stepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since, in general, the projection system will have a magnification factor M (generally<1), the speed v at which the wafer table is scanned will be a factor M times that at which the reticle table is scanned. More information with regard to lithographic devices as here described can be gleaned from International Patent Application WO 97/33205 the entire contents of which are incorporated herein by reference.

In a lithographic apparatus, the size of features that can be imaged onto the wafer is limited by the wavelength of the projection radiation. To produce integrated circuits with a higher density of devices and hence higher operating speeds, it is desirable to be able to image smaller features. Whilst most current lithographic projection apparatuses employ ultraviolet light generated by mercury lamps or excimer lasers, it has been proposed to use shorter wavelength radiation of around 13 nm. Such radiation is termed extreme ultraviolet (EUV) or soft x-ray, and possible sources include laser plasma source or synchrotron radiation from electron storage rings. An outline design of a lithographic projection apparatus using synchrotron radiation is described in "Synchrotron radiation sources and condensers for projection x-ray lithography", J B Murphy et al, Applied Optics Vol. 32 No. 24 pp 6920–6929 (1993) the entire contents of which are incorporated herein by reference.

Other proposed radiation types include electron beams and ion beams. These types of beam share with EUV the requirement that the beam path, including the mask, substrate and optical components, be kept in a high vacuum. This is to prevent absorption and/or scattering of the beam, whereby a total pressure of less than about $10^{-6}$ millibar is typically necessary for such charged particle beams. Wafers can be contaminated and optical elements for EUV radiation can be spoiled by the deposition of carbon layers on their surface, which imposes the additional requirement that hydrocarbon partial pressures should generally be kept below $10^{-8}$ or $10^{-9}$ millibar. Otherwise, for apparatuses using EUV radiation, the total vacuum pressure need only be $10^{-3}$ or $10^{-4}$ mbar, which would typically be considered a rough vacuum.

Further information with regard to the use of electron beams in lithography can be gleaned, for example, from U.S. Pat. Nos. 5,079,122 and 5,260,151, as well as from EP-A 0 965 888, the entire contents of each are incorporated herein by reference.

Working in such a high vacuum imposes quite onerous conditions on the components that must be put into the vacuum and on the vacuum chamber seals, especially those around any part of the apparatus where a motion must be fed-through to components inside the chamber from the exterior. For components inside the chamber, materials that minimize or eliminate contaminant and total outgassing, i.e. both outgassing from the materials themselves and from gases adsorbed on their surfaces, should be used. It would be very desirable to be able to reduce or circumvent such restrictions.

SUMMARY OF THE INVENTION

It is an object of the present invention to provide an improved motion feed-through to allow control of an object, particularly an object table of a lithographic apparatus, placed within a vacuum chamber from the outside.

According to the present invention, this and other objects are achieved in a lithographic projection apparatus that has a radiation system for supplying a projection beam of radiation; a first object table provided with a mask holder for holding a mask; a second object table provided with a substrate holder for holding a substrate; and a projection system for imaging an irradiated portion of the mask onto a target portion of the substrate. The lithographic projection apparatus also has a vacuum chamber having a wall enclosing at least one of the first and second object tables, the vacuum chamber wall having an aperture therein; a sliding seal for sealing the aperture and displaceable in at least one direction parallel to the vacuum chamber wall through a predetermined rang, of movement whilst maintaining the seal of the aperture; a mechanical linkage for transmitting displacement of the sliding seal to the object table within the vacuum chamber to cause corresponding movement thereof; and a positioning component for displacing the sliding seal, thereby to displace the object table within the vacuum chamber.

The sliding seal arrangement allows a relatively large movement (compared to conventional bellows, for example) to be fed through into the vacuum chamber and also can be constructed to withstand repeated and rapid movements, with a mean time between failures of a very large number of cycles.

Current lithography apparatuses are designed for use in clean room environments and therefore some steps have conventionally been taken to reduce possible sources of contamination of wafers that are processed by the apparatus. However, conventional designs of wafer, mask and transfer stages are very complicated and employ large numbers of components for sensor and drive arrangements. Such stages also need to be provided with large numbers of signal and control cables and other utilities. The present invention avoids the difficult and detailed task of making such large numbers of components vacuum-compatible, or replacing them with vacuum-compatible equivalents, by adopting the principle of locating as many components and functions as possible outside the vacuum chamber. The present invention thus avoids the need to vacuum-proof many or most of the numerous components, by providing appropriate mechanical feed-throughs with innovative sealing arrangements. Likewise, the present invention avoids difficulties in reducing vibrations inevitable in vacuum apparatuses, particularly where powerful pumps are provided, by isolating as far as possible vibration sensitive components from the vacuum chamber wall.

In a preferred embodiment of the invention, the sliding seal comprises a plate that may be supported against the vacuum chamber wall by a differentially pumped air bearing.

According to another aspect of the invention, a lithographic projection apparatus has a radiation system for supplying a projection beam of radiation; a first object table provided with a mask holder for holding a mask; a second object table provided with a substrate holder for holding a substrate; and a projection system for imaging an irradiated portion of the mask onto a target portion of the substrate. The lithographic projection apparatus has a first vacuum chamber accommodating at least one of the first and second object tables; a second vacuum chamber adjacent to the first vacuum chamber; a support extending from the second vacuum chamber to the first vacuum chamber and moveably supporting the object table accommodated within the first vacuum chamber; a sliding seal plate connected to the support for separating the first and second vacuum chambers, the sliding seal plate being moveable in at least one direction in its plane and extending outside the first and second vacuum chambers; and a positioning component situated outside the first and second vacuum chambers for displacing the sliding seal plate, thereby to displace the object table within the first vacuum chamber.

According to a further aspect of the invention there is provided a lithographic projection apparatus has a radiation system for supplying a projection beam of radiation; a first object table provided with a mask holder for holding a mask; a second object table provided with a substrate holder for holding a substrate; and a projection system for imaging an irradiated portion of the mask onto a target portion of the substrate. The lithographic projection apparatus has a first vacuum chamber accommodating at least one of the first and second object tables; a second vacuum chamber adjacent to the first vacuum chamber and separated therefrom by a vacuum chamber wall having an aperture; a first stage provided in the second vacuum chamber and displaceable over a first range of movement in a first plane; a second stage supported by the first stage and displaceable over a second range of movement in a second plane, the first and second planes being substantially parallel and the first range of movement being greater than the second range of movement, the second stage supporting the object table within the first vacuum chamber through the aperture; and an annular sliding seal plate connected to the first stage, the sliding seal plate opposing portions of the vacuum chamber wall and the second stage so as to separate said first and second vacuum chambers throughout the first and second ranges of movement.

According to a yet further aspect of the invention a method of manufacturing a device uses a lithographic projection that has a radiation system for supplying a projection beam of radiation; a first object table provided with a mask holder for holding a mask; a second object table provided with a substrate holder for holding a substrate; and a projection system for imaging an irradiated portion of the mask onto a target portion of the substrate. The lithographic projection apparatus used has a vacuum chamber having a wall enclosing at least one of the first and second object tables, the vacuum chamber wall having an aperture therein; a sliding seal for sealing the aperture and displaceable in at least one direction parallel to the vacuum chamber wall through a predetermined range of movement whilst maintaining the seal of the aperture; a mechanical linkage for transmitting displacement of the sliding seal to the object table within the vacuum chamber to cause corresponding movement thereof; and positioning means for displacing the sliding seal thereby to displace the object table within the vacuum chamber; the method includes mounting a mask on the first object table; mounting a substrate on the second object table; and exposing the substrate to an image of the mask.

In a manufacturing process using a lithographic projection apparatus according to the invention a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such, is etching, ion-implantation (doping) metallisation, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4 the entire contents of which are incorporated herein by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

BRIEF DESCRIPTION OF THE DRAWINGS

The present invention and its attendant advantages will be described below with reference to exemplary embodiments and the accompanying schematic drawings, in which.

DETAILED DESCRIPTION OF THE PREFERRED EMBODIMENTS

In the various drawings, like parts are indicated by like references.

Embodiment 1

Figure 1:
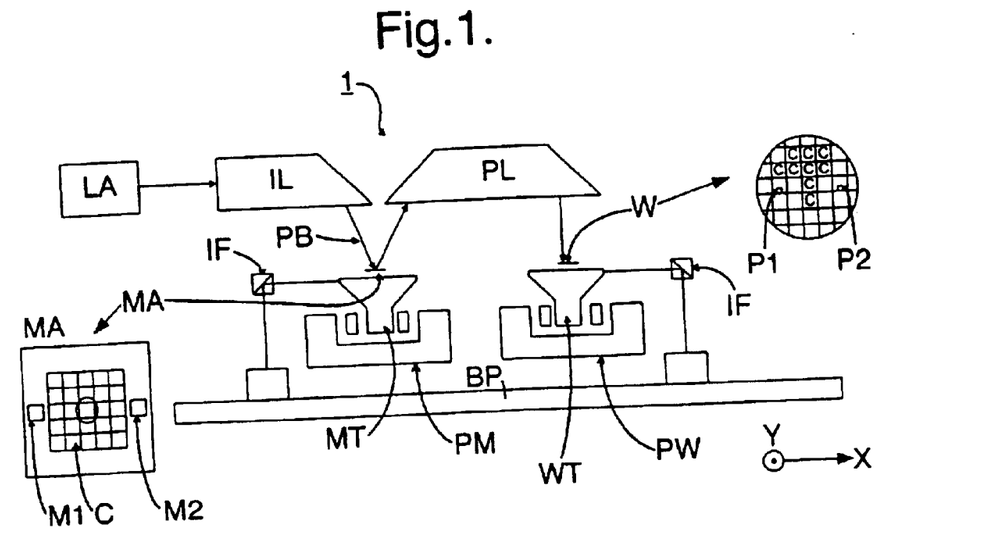
FIG. 1 depicts a lithographic projection apparatus according to a first embodiment of the invention.

FIG. 1 schematically depicts a lithographic projection apparatus 1 according to the invention. The apparatus comprises:

a radiation system LA, IL for supplying a projection beam PB of radiation (e.g. UV or EUV radiation, electrons or ions);

a first object table (mask table) MT provided with a mask holder for holding a mask MA (e.g. a reticle), and connected to a first positioning component PM for accurately positioning the mask with respect to item PL;

a second object table (substrate table) WT provided with a substrate holder for holding a substrate W (e.g. a resist-coated silicon wafer), and connected to a second positioning component PW for accurately positioning the substrate with respect to item PL;

a projection system ("lens") PL (e.g. a refractive or catadioptric system, a mirror group or an array of field deflectors) for imaging an irradiated portion of the mask MA onto a target portion C (die) of the substrate W.

The radiation system comprises a source LA (e.g. an undulator or wiggler provided around the path of an electron beam in a storage ring or synchrotron, a plasma source, or an electron or ion beam source) which produces a beam of radiation. This beam is passed along various optical components included in illumination system IL, e.g. for the purpose of shaping and/or collimating the resultant beam PB, and/or making it uniformly intense throughout its cross-section.

The beam PB subsequently impinges upon the mask MA which is held in a mask holder on a mask table MT. Having been selectively reflected (or transmitted) by the mask MA, the beam PB passes through the "lens" PL, which focuses the beam PB onto a target area C of the substrate W. With the aid of the positioning component PW and the interferometric displacement measuring device IF, the substrate table WT can be moved accurately, e.g. so as to position different target areas C in the path of the beam PB. Similarly, the positioning componnt PM and the interferometric displacement measuring device IF can be used to accurately position the mask MA with respect to the path of the beam PB, e.g. after mechanical retrieval of the mask MA from a mask library or during a scanning motion. In general, movement of the object tables MT, WT will be realized with the aid of a long stroke module (course positioning) and a short stroke module (fine positioning), which are not explicitly depicted in FIG. 1.

The depicted apparatus can be used in two different modes:

In step mode, the mask table MT is kept essentially stationary, and an entire mask image is projected in one go (i.e. a single "flash") onto a target area C. The substrate table WT is then shifted in the X and/or Y directions so that a different target area C can be irradiated by the beam PB;

In scan mode, essentially the same scenario applies, except that a given target area C is not exposed in a single "flash". Instead, the mask table MT is movable in a given direction (the so-called "scan direction", e.g. the X direction) with a speed v, so that the projection beam PB is caused to scan over a mask image; concurrently, the substrate table WT is simultaneously moved in the same or opposite direction at a speed V=Mv, in which M is the magnification of the lens PL (e.g., M=¼ or ⅕). In this manner, a relatively large target area C can be exposed, without having to compromise on resolution.

Embodiment 2

Figure 2:
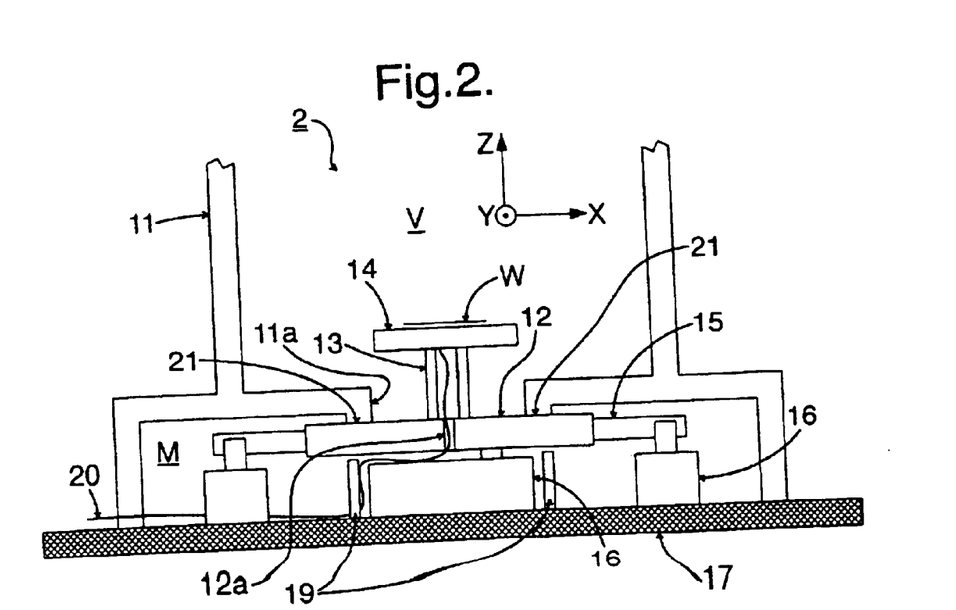
FIG. 2 is a cross-sectional view of a wafer stage of a lithographic projection apparatus according to a second embodiment of the invention.

A lithographic apparatus 2 according to a second embodiment of the invention is shown schematically and in cross-section in FIG. 2. The vacuum chamber V is bounded by walls 11 which define an aperture 11a in the floor of the chamber. During use of the apparatus, the vacuum chamber V is kept at a sufficient vacuum by vacuum pumps (not shown) of appropriate type. The aperture 11a is sealed by a sliding seal formed by sliding seal plate 12 in the middle of which is provided wafer support pillar 13. Pillar 13 supports the fine stage, or short stroke wafer support chuck, 14 which in turn carries the wafer W.

The long-stroke motion of the wafer W, by which different areas of it are positioned under the lens (not shown) of the lithographic apparatus for exposure, is accomplished by moving the whole sliding seal plate 12. To this end, the aperture 11a is shaped and dimensioned to accommodate the desired range of movement of the long-stroke stage and the pillar 13. In an apparatus intended to expose wafers of 300 mm diameter and with a pillar of 100–150 mm diameter, for example, the aperture 11a might be a square of 480 mm sides to provide room for sensors, etc. around the edge of the wafer. The sliding seal plate 12 must be of a shape and size to maintain a seal over the aperture throughout its entire range of movement, and is in this example therefore a square of 1200 mm sides, for example. This size allows a seal width of 120 mm each side. A circular aperture and sealing plate may also be suitable.

Sliding seal plate 12 is driven to translate in orthogonal X- and Y- axes as well as to provide rotation, $\phi_Z$, about the Z-axis, via beams 15 and drivers 16 provided in motor compartment M. The drive arrangements are described further below with reference to FIG. 3.

It will be appreciated that, in use, the major load on the sliding seal plate 12 will be the pressure differential between the vacuum chamber V and the motor compartment M, which is normally kept at atmospheric pressure (or a slightly different pressure in a clean room environment). This upward force (inward) will normally substantially exceed the weight of the long-stroke stage and the other components it carries. The present invention provides differentially pumped gas (air) bearings 21, which are preloaded by the difference between the pressure force and the weight of the sealing plate and the components it supports, around the aperture 11a. These air bearings 21 are described further below with reference to FIG. 4 and in European Patent application 99201193.2 entitled "Gas-Bearings for use in Vacuum Chambers and their Application in Lithographic Apparatus" and a concurrently filed U.S. application of similar title (Applicant's ref: P-0133.010) the entire contents of which are incorporated herein by reference. To support the sliding seal plate 12 when the vacuum chamber is not evacuated, e.g. for maintenance, supports or bearings 19 mounted on base plate 17 are provided.

Cables 20 providing control and measuring signals, as well as other "utilities", to the short-stroke stage 14 are provided through a hole 12a in the sliding seal plate 12 and the hollow interior of the pillar 13.

To provide an adequate seal around the entire periphery of the aperture 11a, it is necessary to ensure that deformation of the sliding seal plate 12 is kept within acceptable limits. According to this embodiment of the invention this is effected by providing a plate of sintered $Al_2O_3$ ($\rho$=3700 kg/m$^3$, E=3.5×10$^{11}$N/m$^2$, $\upsilon$(Poisson's ratio)=0.22) of thickness 100 mm. Other suitable materials, such as SiC foam, may also be used. Assuming, for ease of calculation, that the air bearing is annular with radius, r, 370 mm and that the uniform load on the plate, $\rho$, is atmospheric pressure at 10$^5$N/m$^2$, the angular deflection at the circumference, $\theta$, is given by the following expression:

$$\theta = \frac{qr^3}{8D \cdot (1 + \upsilon)} \quad [1]$$

where:

$$D = \frac{E \cdot t^3}{12 \cdot (1 - \upsilon^2)} \quad [2]$$

For an $Al_2O_3$ plate of thickness 100 mm, the plate constant D≈3.1×10$^7$ Nm which leads to an angular deflection $\theta$≈16.6×10$^{-6}$ rad and hence a deflection of about 1 $\mu$m in the air beating area.

Figure 3:
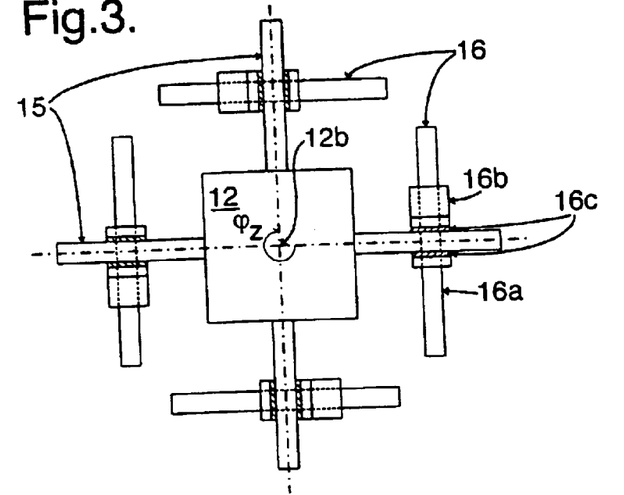
FIG. 3 is a plan view of the drive arrangements of the wafer stage of FIG. 2.

A possible drive mechanism for the sliding seal plate 12 is shown in FIG. 3. As there shown, four drivers 16 act on respective ones of beams 15 which extend perpendicularly out from the middle of each side of the plate 12. The drivers 16 each comprise a track 16a which carries the stator of a linear motor and a carriage 16b carrying the coils. The driving forces are transferred to the beams 15, and thence to the plate 12, by thrust air bearings 16c which allow for lateral movement and a limited amount of angular movement, $\phi_Z$, to accommodate fine adjustments. X, Y and $\phi_Z$ movements can be achieved with only three motors, thus in this embodiment one pair of parallel motors is controlled as one. A water-cooled linear motor can easily provide a force of up to 1100 N, so that four such motors can provide adequate acceleration even when the stage plate and associated parts weigh up to 500 kg.

The tracks 16a may be fixed, e.g. to the base plate of the apparatus, so the drive forces act against a static reaction frame. Alternatively, the tracks 16a may be free to move longitudinally, e.g. by being supported on air-bearings, and relatively massive so as to act as balance masses for the drive forces to act against.

In this embodiment the beams 15 are positioned so that the applied forces act on lines passing through the center of gravity 12b of the sliding seal plate 12, both in the horizontal plane as illustrated and also vertically. This reduces bending moments in the plate 12 and other parts of the force path from the motor towards the overall center of gravity of the driven mass. In a variation of the first embodiment (not shown) the overall footprint of the long-stroke stage can be reduced by mounting the beams 15 underneath the stage plate 12.

Figure 4:
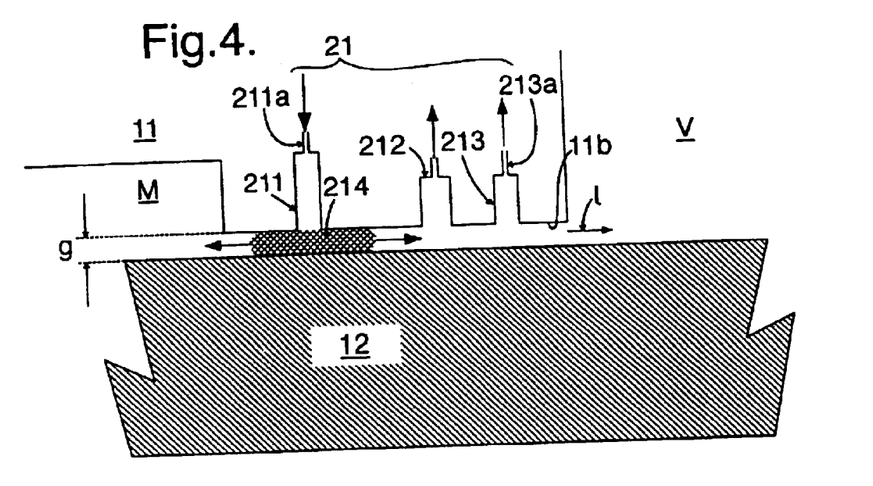
FIG. 4 is a cross-sectional view of a differentially pumped air bearing used in the wafer stage of FIG. 2.

As shown schematically in FIG. 4, which is a cross-section through part of the vacuum chamber wall 11 and the sliding seal plate 12, the plate 12 is held off the vacuum chamber wall 11 by air beating 21 which enables a constant gap, g, of 5 $\mu$m to be maintained. For such a gap, the surface 11b of the vacuum chamber wall 11 in the vicinity of the bearing, and the surface of the plate 12 over the area of travel of the bearing, can be finished to an RMS surface roughness of less than 0.8 $\mu$m, though they need not be flatter than 0.4 $\mu$m RMS surface roughness. This can readily be achieved with known mechanical polishing techniques. In some applications a gap in the range of from 5 $\mu$m to 10 $\mu$m may be appropriate and the surfaces need not be finished to such high tolerances. Clean air (or other gas, e.g. $N_2$) is supplied continually through air feed 211 at a pressure of several atmospheres to generate a high pressure region 214. The supplied air will flow towards the motor compartment M and also the vacuum chamber V, where its presence would, of course, be undesirable. An escape path to atmospheric pressure, e.g. to the motor chamber M, is provided via groove 212. To prevent further the air that forms the air bearing becoming an unacceptable leak into the vacuum chamber V, it is pumped away via vacuum conduit 213. If desired, the escape, path 212 may also be pumped. In this way, the residual leakage, l, into the vacuum chamber V can be kept within acceptable levels.

In this embodiment the lower parts of the air feed 211 and the vacuum conduit 213, as well as the escape path 212 are elongate grooves extending along the entire length of the perimeter of the seal. Air feed pipes 211a and vacuum pipes 213a are provided at intervals along the grooves.

Figure 5:
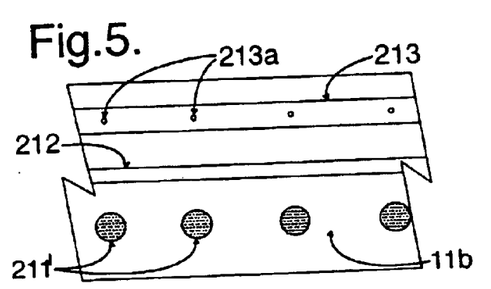
FIG. 5 is a plan view of an alternative differentially pumped air bearing usable in the invention.
Figure 5A:
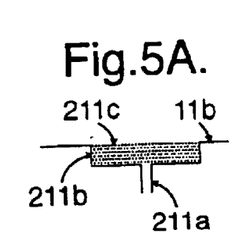
FIG. 5A is an enlarged cross-section of a part of the differentially pumped air bearing of FIG. 5.

In a variation to the second embodiment, shown in FIG. 5, which is a view from below of a part of the vacuum wall 11, the air feeds 211' that provide the air bearing are discrete. At the end of each air feed pipe there is a cylindrical enlargement 211b, shown in cross-section in FIG. 5A, that is filled with a porous plug 211c. The porous plug 211c is preferably made of graphite, which enables it to be placed in the enlargement 211b after machine finishing of the lower surface 11b of the vacuum wall 11 and then scraped smooth.

In both variants of the air bearing described above, a single vacuum groove is provided between the air feed 211 and the vacuum chamber V. In other variants, two or more vacuum grooves may be provided, with those nearer the vacuum chamber V being pumped to higher vacuum levels.

Figure 6:
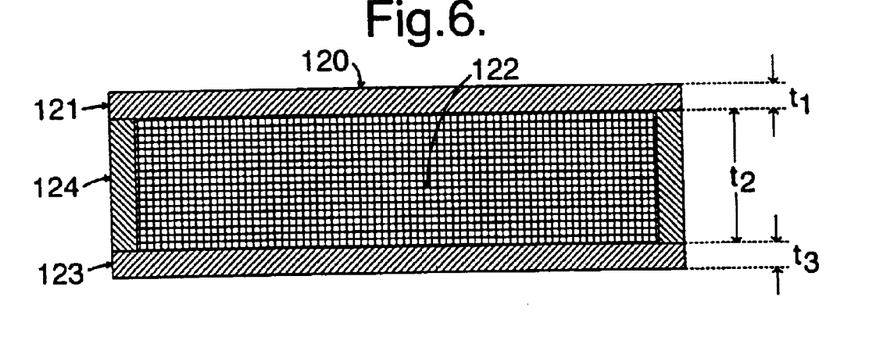
FIG. 6 is a cross-sectional view of an alternative sliding seal plate usable in the invention.
Figure 6A:
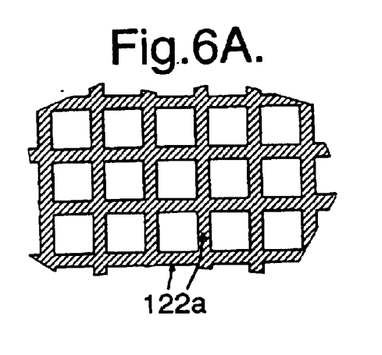
FIGS. 6A and 6B are plan views of alternative fillings for the sliding seal plate of FIG. 6.
Figure 6B:
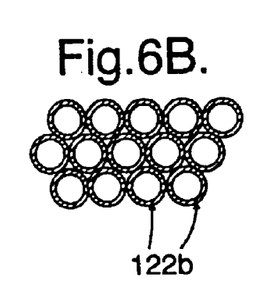

In a further variation of the second embodiment, which may be combined with the variations described above, the weight of the sliding seal plate is reduced by forming it of a plate 120 having a sandwich construction. This is shown in FIG. 6 which is a cross-section on a vertical plane through the sliding seal plate. The upper and lower skin plates 121, 123 are each formed of solid plates of, e.g., sintered $Al_2O_3$ with respective thicknesses $t_1$ and $t_3$. The sandwich filling 122 is of thickness $t_2$ and may be of various materials, such as a grid structure of $Al_2O_3$ walls 122a, as shown in FIG. 6A, or close-packed hollow glass cylinders 122b, as shown in FIG. 6B. Other alternatives include glass and ceramic foams, for example. In each variation, the function of the sandwich filling is to transmit shear forces between the two skin plates 121, 123 and so the material and structure chosen must have a high modulus of elasticity, E.

For a plate 120 with a sintered $Al_2O_3$ grid structure filling, the strength and mass of the plate are dependent on the space factor, Δ, which is defined as the total cross-sectional area of the grid structure divided by the total cross-sectional area of the plate, and is used to correct the equations for shear and bending deformation. It can be calculated that for a plate of total thickness $(t_1+t_2+t_3)$ of 200 mm the minimum plate mass is achieved with top and bottom plates 121, 123 of thickness $(t_1, t_3)$ 15 mm and a space factor for the grid of 0.15, for example a grid wall thickness of 15 mm and a pitch of 110 mm.

According to the invention, the sandwich plate 120 has continuous side walls 124 or else the edges of the sandwich filling 122 are sealed so as to form a hermetic seal for the interior. Prior to the sealing of the interior, it is evacuated to a suitable vacuum level. This prestresses the sandwich structure and prevents a pressure differential across one skin plate (when the plate is used as a part of a vacuum chamber) that would tend to delaminate the sandwich structure. The plate may be constructed to ensure that the vacuum inside remains sufficiently high for the entire expected life of it, or a valve may be provided to allow periodic re-evacuation of the interior.

It will be appreciated that this evacuated sandwich structure has wider application than as the sliding seal plate of the invention and may, in particular, be used advantageously as the, or part of the, wall, whether sliding or fixed, of any vacuum chamber.

Embodiment 3

Figure 7:
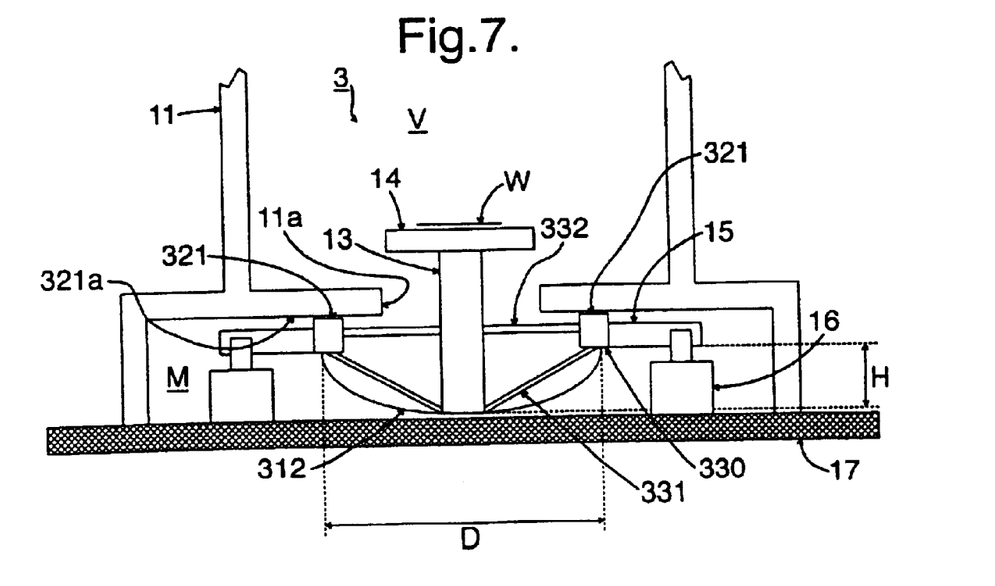
FIG. 7 is a cross-sectional view of a wafer stage of a lithographic projection apparatus according to a third embodiment of the invention.

A third embodiment of a lithography apparatus 3 according to the invention is shown in FIG. 7. In this apparatus the sliding seal is formed by an inverted dome, or bowl, 312 mounted on an annular frame 330. The bowl 312 is relatively thin and is shaped so that the perpendicular pressure load on the outer surface is resisted by in-plane strain in the bowl. Load variations then result in geometry scaling rather than local deformations. For a bowl of width, D, 1200 mm, which would be suitable for a lithographic apparatus with dimensions and movement range as those of the second embodiment, a suitable radius of curvature at the center, R, would be 0.8×D. This is gradually reduced to a radius of curvature at the edge, r, of 0.15×D. The height, H, of the bowl would then be 0.25×D. The bowl sheet material is connected to the frame 330 perpendicularly, thus avoiding undesired loads on the bearing ring. Other configurations for the bowl that avoid bending moments are known from bridge construction.

In the third embodiment, the sliding movement of the bowl is enabled by differentially pumped air bearings 321 provided in the frame 330 and acting against a bearing surface 321a provided on the bottom of the vacuum chamber wall 11. The air bearings 321 are otherwise similar to those of the second embodiment.

Whilst the bowl 312 resists the pressure differential between the motor chamber M and the vacuum chamber V, the weight of the fine stage 14 and the supporting pillar 13 is borne by a plurality of radial stays 331 which suspend the pillar 13 and fine stage 14 from the frame 330. The pillar 13 is also stabilized by a plurality of radial spokes 332 so that the fine stage remains stable in motion, which, as with the second embodiment, is effected by drivers 16. Thrust from the drivers 16 is again transferred to the fine stage via beams 15 which in this embodiment are attached to the frame 330.

Embodiment 4

Figure 8:
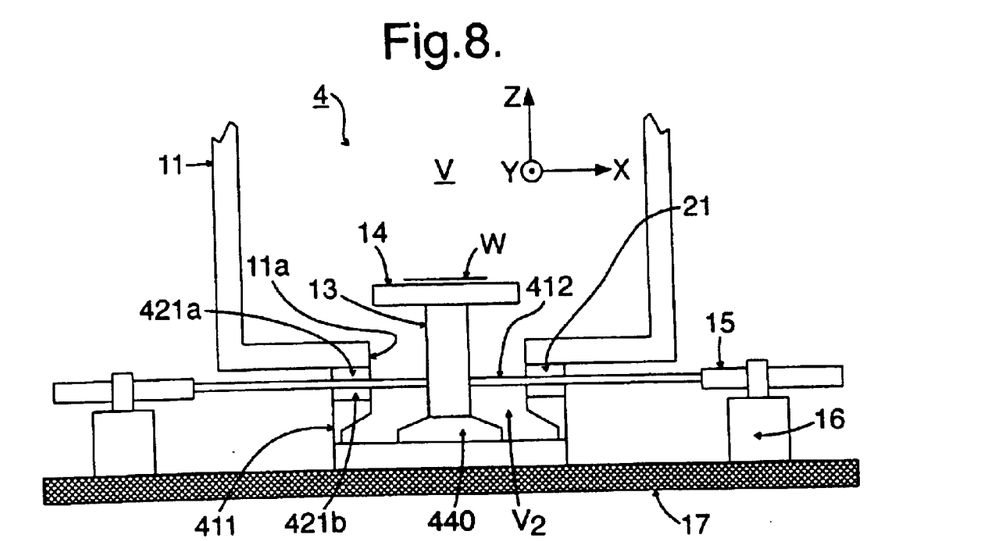
FIG. 8 is a cross-sectional view of a wafer stage of a lithographic projection apparatus according to a fourth embodiment of the invention.

A lithography apparatus 4 according to a fourth embodiment of the invention is shown schematically in FIG. 8. In this embodiment the pressure differential across the sliding seal plate 412 is reduced or eliminated by providing a second vacuum chamber $V_2$ below it. The sliding seal plate 412 can therefore be made much thinner as it only has to bear the acceleration forces required to move the fine stage 14, and little or no pressure forces. Torsion forces can be reduced by ensuring that the drive forces are applied in the plane of the sliding seal plate 412 and that the center of gravity of the total moving mass also lies in the plane of the sliding seal plate.

The sliding seal plate is moved in X, Y and $\phi_Z$ directions via drivers 16 which again act on beams 15, which in this case are connected to the edges of the sliding seal plate 412. The sliding seal plate 412 moves between two opposed differentially pumped air bearings 421a and 421b. Air bearing 421a is similar to that of the second embodiment and as before is provided in the wall 11 of the vacuum chamber V. Air bearing 421b is also similar but inverted and provided on the wall 411 of the second vacuum chamber $V_2$. Since there is little net vertical force on the sliding seal plate 421, the air bearings 421a and 421b do not need to exert a substantial thrust, but merely maintain the sealing gaps and allow movement in the X Y and $\phi_Z$ directions. To avoid over constraining the plate 412, one bearing is fixed in the Z direction and the other is preloaded.

The second vacuum chamber $V_2$ accommodates a foot 440 which supports the fine stage 14 via pillar 13. The foot 440 is provided with its own beating, e.g. a differentially pumped air bearing as described above, to allow movement of the fine stage 14. Because the second vacuum chamber $V_2$ is isolated from the main vacuum chamber V, lower demands are placed on the vacuum level within it. Chamber $V_2$ can therefore accommodate feed lines and cables made of materials which would be unacceptable in the main vacuum chamber V.

Embodiment 5

Figure 9:
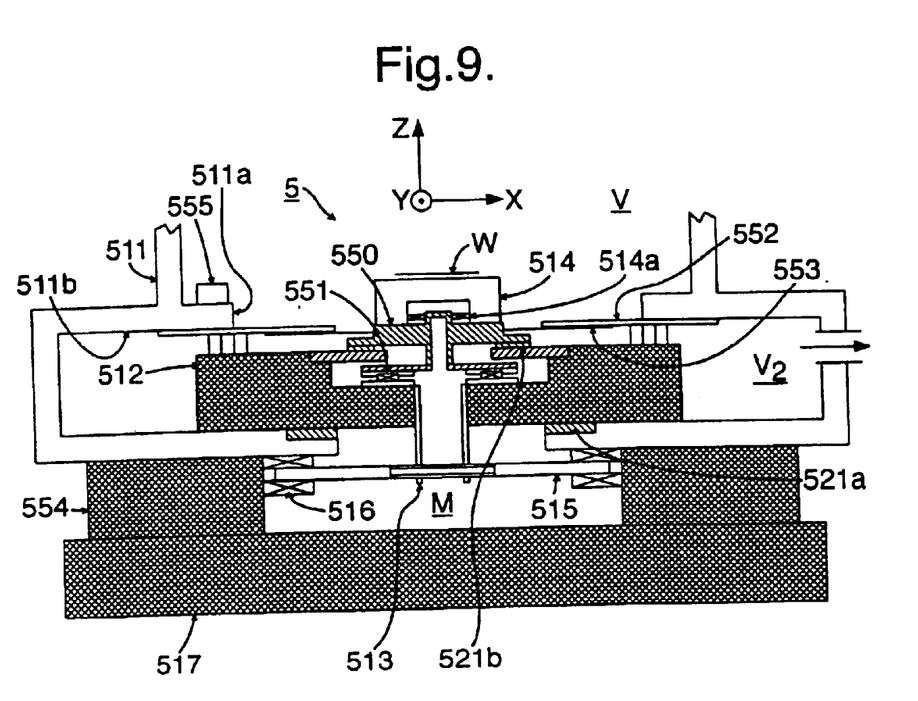
FIG. 9 is a cross-sectional view of a wafer stage of a lithographic projection apparatus according to a fifth embodiment of the invention.

A fifth embodiment of the invention, comprising lithographic apparatus 5, is shown schematically in FIG. 9. This embodiment additionally incorporates a three-stage concept that is further described in European Patent application 99201192.4 entitled "Multi-stage Drive Arrangements and their Application in Lithographic Apparatus" and a concurrently filed application of similar title (Applicant's ref P-0132.010) the entire contents of which are incorporated herein by reference. The fifth embodiment of the invention is particularly adapted for step-and-scan operation.

Lithographic apparatus 5 includes a long-stroke sliding seal plate 512 which is analogous to the sliding seal plate 12 of the second embodiment and is accommodated in second vacuum chamber $V_2$. Fine stage 514 is accommodated in the primary vacuum chamber V and provides fine positioning for the wafer W using drivers 514a. Between these two stages an intermediate stage 550 is provided. In step-and-scan operation of this embodiment, the long-stroke sliding seal plate 512 is driven at a constant speed along the length of a row or column of dies that are to be exposed. The intermediate stage 550 is then driven relative to the long-stroke sliding seal plate 512 in a figure of eight motion so that the net motion of the wafer underneath the exposure point is a meander appropriate for the step-and-scan operation. This arrangement reduces the acceleration forces that need be exerted on the machine base frame. The long-stroke sliding seal plate 512 acts as a balance mass for the intermediate stage 550, but does not itself require a balance mass as its accelerations are low.

The main vacuum chamber V is kept at a pressure less than $10^{-6}$ mbar, preferably in the range of from $10^{-7}$ to $10^{-8}$ mbar, and the second vacuum chamber $V_2$ at a pressure of the order of $10^{-5}$ to $10^{-6}$ mbar. To enable these vacuum levels to be achieved, the long-stroke stage plate 512 is supported by differentially pumped air bearings 521a which are similar to those of the second embodiment and maintain a constant gap in the range of from 5 to 10 $\mu$m. The scanning stage 550 is also supported by similar air bearings 521b.

The secondary vacuum chamber $V_2$ is isolated from the primary vacuum chamber V by a sliding seal arrangement formed by upper sliding seal plate 552 mounted on the long-stroke sliding seal plate 512 and lower sliding seal plate 553 mounted on the scanning stage 550. The upper sliding seal plate 552 is generally square with a central aperture large enough to accommodate the scanning stage 550 and its range of movement relative to the long-stroke stage. The upper sliding seal plate 552 is somewhat larger than the aperture 511a in the vacuum chamber wall 511 so that whatever the position of the long-stroke stage, a wide portion of the upper sliding seal plate opposes directly the lower surface 511b of the vacuum chamber wall 511. The lower sliding seal plate 553 is also square with a central aperture that is filled by the scanning stage 550. The lower sliding seal plate 553 is likewise somewhat larger than the aperture in the upper sliding seal plate 551 so that whatever the position of the scanning stage 550 relative to the long-stroke stage 512, a wide portion of the entire periphery of the lower sliding seal plate 553 opposes directly the bottom surface of the upper sliding seal plate 552. Because the forces exerted by the pressure differential between the primary and secondary vacuum chambers are negligible, and the upper and lower sliding seal plates are not load bearing, there is no need for an air bearing between them or between the upper sliding seal plate and the vacuum chamber wall 511. Instead, the gaps between the two plates and between the upper plate and the vacuum chamber wall are made to be about 500 $\mu$m or less and the overlap is made wide enough to reduce leakage to acceptable levels. The various sealing plates and apertures may also be circular to accommodate a circular wafer and chuck.

The long-stroke stage plate 512 may be driven by an H-drive arrangement including linear motors 516 which move transverse beam 515 laterally to provide, e.g., Y and $\phi_Z$ movement, and a further linear motor (not shown) mounted longitudinally on the transverse beam 515 which acts on pillar 513 to provide movement, e.g., in the X direction. The motor chamber M which accommodates the long-stroke drive is kept at below, e.g., 0.1 mbar but this chamber is isolated from the main vacuum chamber V so that the long-stroke drive arrangements need not be high-vacuum compatible. An appropriate preload to the long-stroke stage plate bearing 521a is provided by the net force on the plate resulting from the pressure load over the aperture area and the weight of the long-stroke stage plate 512. The drive of the long-stroke stage acts against the base 517 via mounts 554. Because the long-stroke stage moves at a substantially constant speed, the need for a balance mass can be avoided. The drive 551 for the intermediate stage 550 may be an arrangement of linear motors acting via thrust air bearings on beams, similar to that described above with reference to FIG. 3. The relatively large mass of the long-stroke stage, mostly the long-stroke sliding seal plate 512, acts as a balance mass for the scanning stage 550.

Cabling and supply lines (not shown) to the scanning stage 550 and fine stage 514 can be routed through the motor compartment M and the interior of hollow pillar 513. The position of the fine stage 514 can be monitored via position sensing device 555, which may be of the interferometer type, for example.

Embodiment 6

Figure 10:
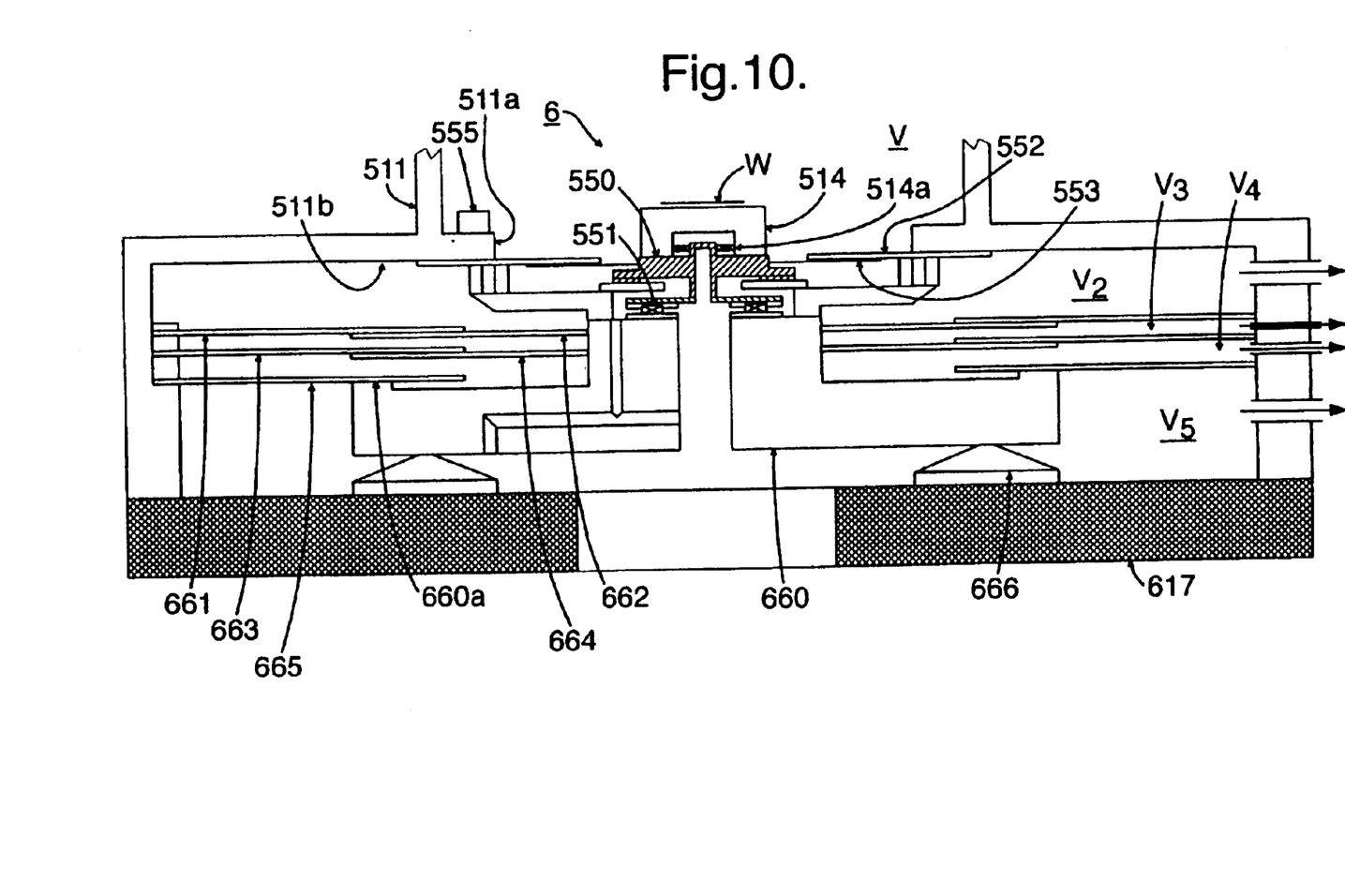
FIG. 10 is a cross-sectional view of a wafer stage of a lithographic projection apparatus according to a sixth embodiment of the invention.

A lithographic apparatus 6 according to a sixth embodiment of the invention is shown schematically in FIG. 10. The sixth embodiment is a variation of the fifth embodiment and has a number of parts in the fine and scanning stages in common, mostly indicated by like reference numerals. A description of the common parts is omitted for the sake of brevity.

In the sixth embodiment the primary vacuum chamber V is sealed by a labyrinth sliding seal arrangement forming intermediate vacuum chambers $V_2$ to $V_5$ which are separately pumped to decreasing vacuum levels by respective vacuum pumps (not shown). As before, the primary vacuum chamber can be maintained in use at a vacuum level of about $10^{-7}$ to $10^{-8}$ mbar, whilst the intermediate vacuum chambers are maintained at levels as follows, for example:

$V_2$—$2.5 \times 10^{-6}$ mbar
$V_3$—$5 \times 10^{-4}$ mbar
$V_4$—0.1 mbar
$V_5$—1 mbar.

The labyrinth sliding seal comprises first to fifth sliding seal plates 661 to 665 together with sealing surface 660*a* provided on the upper surface of the long-stroke stage plate 660. In other embodiments fewer stages may suffice. The first, third and fifth sliding seal plates, 661, 663 and 665, project inwardly from the vacuum chamber wall, and each has a central aperture large enough to accommodate the range of movement of the long-stroke stage plate 660, as well as the cross-section of the long-stroke stage plate at that level. The second and fourth sliding seal plates 662, 664 project outwardly from the long-stroke stage, and have an outer perimeter large enough that, whatever the position of the long-stroke stage plate throughout its normal range of movement, there is an overlap with the odd-numbered sliding seal plates. Similarly, the sealing surface 660*a* on the long-stroke stage plate 660 is arranged at a position so that it directly opposes the fifth sliding seal plate 665 at all positions of the long-stroke stage plate.

The first and second sliding seal plates 661, 662 together isolate the first intermediate vacuum chamber $V_2$ from the second $V_3$, the third and fourth sliding seal plates 663, 664 isolate the second intermediate vacuum chamber $V_3$ from the third $V_4$ and the fifth sliding seal plate 665 and sealing surface 660*a* isolate the third intermediate vacuum chamber $V_4$ from the fourth $V_5$. In each case, the gap between the opposed plates and the extent of the overlap is chosen to ensure that leakage from the chamber of higher pressure into the chamber of lower pressure is limited to a level that the respective vacuum pumps can tolerate. The gaps between first and second and between third and fourth sliding seal plates may be of order 500 $\mu$m, whilst the gap between the fifth sliding seal plate 665 and the sealing surface 660*a* may be of order 100 $\mu$m.

In the sixth embodiment the long-stroke stage plate 660 is supported over the base 617 by (conventional) air bearings provided in feet 666. The drive arrangements (not shown) can be the same as those of the fifth embodiment The invention is described above in relation to preferred embodiments; however it will be appreciated that the invention is not limited by the above description. In particular, the invention has been described above in relation to the wafer stage of a lithographic apparatus but is equally applicable to the mask stage of such an apparatus or to any apparatus in which a long-stroke manipulator must be fed-through into a vacuum chamber.

What is claimed is:

1. A remote manipulator apparatus for feeding an exterior motion through an aperture in a vacuum chamber wall to an object in the vacuum chamber, comprising:
   a sliding seal constructed and arranged to seal said aperture and said sliding seal being displaceable in at least one direction parallel to said vacuum chamber wall while maintaining said seal; and
   a mechanical linkage connecting said sliding seal and said object to transmit movement of said sliding seal to said object, whereby said exterior motion is applied to said sliding seal externally of said vacuum chamber.

2. An apparatus according to claim 1, wherein said sliding seal comprises a sliding seal plate of a size to cover said aperture at all positions in the desired range of movement of the manipulator apparatus.

3. An apparatus according to claim 1, wherein said sliding seal comprises a bowl mounted at its periphery on an annular bearing ring, said bowl being of a size to cover said aperture at all positions in the desired range of movement of the manipulator apparatus.

4. An apparatus according to claim 1, wherein said vacuum chamber wall is a floor of said vacuum chamber and said mechanical linkage comprises a pillar projecting upwardly from said sliding seal and supporting said object within said vacuum chamber.

5. An apparatus according to claim 1, wherein said sliding seal comprises a sliding seal plate and a bearing provided between said sliding seal plate and said vacuum chamber wall to allow movement of the sliding seal.

6. An apparatus according to claim 5, wherein said sliding seal plate is rotatable around an axis substantially perpendicular to said sliding seal plate and movable in at least one direction perpendicular to said axis.

7. An apparatus according to claim 5, wherein said bearing includes a gas bearing configured to permit a supply of gas between said sliding seal plate and said vacuum chamber to maintain a gas gap therebetween.

8. An apparatus according to claim 7, wherein said gas gap is in a range of 5 $\mu$m to 10 $\mu$m.

9. An apparatus according to claim 7, wherein said gas is at least one of air and nitrogen.

10. An apparatus according to claim 7, wherein said bearing comprises an escape path to atmospheric pressure to reduce leakage of gas from said gas bearing into said vacuum chamber.

11. An apparatus according to claim 10, wherein said bearing further comprises an evacuating assembly configured to evacuate said gas from said escape path.

12. An apparatus according to claim 1, wherein said sliding seal comprises:
   a bowl mounted around its periphery on an annular frame,
   at least one support structure mounted on said annular frame to support said mechanical linkage, and
   a bearing provided between said annular frame and said vacuum chamber wall to allow movement of said annular frame.

13. An apparatus according to claim 12, wherein said bowl has a surface shaped such that a net load thereon is resisted substantially solely by tension or compression forces in said bowl.

14. An apparatus according to claim 13, wherein a radius of curvature of said surface gradually decreases from a center of said bowl to an edge of said bowl.

15. An apparatus according to claim 12, wherein said bearing comprises:
   a gas bearing adapted to maintain a predetermined clearance to said vacuum chamber wall, and
   an evacuating assembly provided between said gas bearing and said vacuum chamber to reduce leakage of gas from said gas bearing into said vacuum chamber.

16. An apparatus according to claim 1, wherein said sliding seal seals said aperture and substantially isolates a first volume inside said vacuum chamber from a second volume inside a second vacuum chamber adjacent to said first mentioned vacuum chamber.

17. A remote manipulator apparatus for feeding an exterior motion through an aperture in a vacuum chamber wall to an object in the vacuum chamber, comprising:
   a first sliding seal plate substantially larger than the aperture in the vacuum chamber wall, said first sliding seal plate having a first aperture; and
   a second sliding seal plate disposed adjacent to said first sliding plate, said second sliding seal plate being substantially larger than said first aperture, said second sliding seal plate having a second aperture, said second aperture adapted to receive at least a portion of a support stage configured to hold said object,
   wherein a portion of a periphery of said first sliding seal plate opposes a surface of the vacuum chamber wall, and a portion of a periphery of said second sliding seal plate opposes a surface of the first sliding seal plate.

18. An apparatus according to claim 17, wherein a gap between said first sliding plate and the surface of the vacuum chamber wall is less than 500 µm, and a gap between said second sliding seal plate and the surface of the first sliding seal plate is less than 500 µm.

19. An apparatus according to claim 17, wherein said first and second sliding seal plates are configured to slide relative to each other and together isolate a volume inside said vacuum chamber from a second volume inside a second vacuum chamber adjacent to said first mentioned vacuum chamber.

20. An apparatus according to claim 19, wherein a pressure in the first volume is lower than a pressure in the second volume.

21. An apparatus according 20, wherein the pressure in the first volume is in the range of $10^{-7}$ to $10^{-8}$ mbar and the pressure in the second volume is in the range of $10^{-5}$ to $10^{-6}$ mbar.

22. An apparatus according to claim 19, further comprising a sliding seal assembly, said sliding seal assembly comprises a first plurality of annular plates extending inwardly from an internal wall of said second vacuum chamber and a second plurality of annular plates extending outwardly from said stage, said first and second pluralities of plates being mutually parallel, interleaved and overlapping to provide a labyrinthine seal between said second vacuum chamber and a third vacuum chamber throughout a range of movement of said first stage.

23. An apparatus according to claim 17, wherein said first aperture in said first sliding seal plate is adapted to accommodate a movement of said stage provided in said second vacuum chamber.

24. A remote manipulator apparatus, comprising:
a means for sealing an aperture in a wall of a vacuum chamber, said means for sealing displaceable in at least one direction parallel to said vacuum chamber wall while maintaining a seal in said vacuum chamber; and
a means for transmitting movement to an object in the vacuum chamber, said means for transmitting movement connecting said means for sealing to said object,
wherein when exterior motion is applied externally of said vacuum chamber to said means for sealing, movement of said means for sealing is transmitted to said object.

* * * * *